(12) United States Patent
Nozawa

(10) Patent No.: US 10,925,199 B2
(45) Date of Patent: Feb. 16, 2021

(54) COMPONENT MOUNTER

(71) Applicant: FUJI CORPORATION, Chiryu (JP)

(72) Inventor: Mizuho Nozawa, Nukata-gun (JP)

(73) Assignee: FUJI CORPORATION, Chiryu (JP)

( * ) Notice: Subject to any disclaimer, the term of this patent is extended or adjusted under 35 U.S.C. 154(b) by 418 days.

(21) Appl. No.: 15/534,552

(22) PCT Filed: Dec. 10, 2014

(86) PCT No.: PCT/JP2014/082683
§ 371 (c)(1),
(2) Date: Jun. 9, 2017

(87) PCT Pub. No.: WO2016/092651
PCT Pub. Date: Jun. 16, 2016

(65) Prior Publication Data
US 2017/0325370 A1    Nov. 9, 2017

(51) Int. Cl.
*H05K 13/04*    (2006.01)
*H05K 13/08*    (2006.01)

(52) U.S. Cl.
CPC ..... *H05K 13/0413* (2013.01); *H05K 13/0812* (2018.08); *H05K 13/0813* (2018.08)

(58) Field of Classification Search
CPC .... H05K 13/081; H05K 13/082; H05K 13/08; H05K 13/0812; H05K 13/0815
See application file for complete search history.

(56) References Cited

U.S. PATENT DOCUMENTS

2005/0225631 A1* 10/2005 Van Der Sanden .......................... H05K 13/0812
348/87

FOREIGN PATENT DOCUMENTS

| JP | 2003-8295 A | 1/2003 | |
|----|----|----|----|
| JP | 2008-311476 A | 12/2008 | |
| JP | 2011-86847 A | 4/2011 | |
| JP | 2014-216621 A | 11/2014 | |
| WO | 2009/066592 A1 | 5/2009 | |
| WO | WO-2009066592 A1 * | 5/2009 | ......... H05K 13/0452 |
| WO | WO2013161878 A1 * | 10/2013 | |
| WO | WO-2014178265 A1 * | 11/2014 | ......... H05K 13/0812 |

OTHER PUBLICATIONS

International Search Report dated Feb. 10, 2015, in PCT/JP2014/082683, filed Dec. 10, 2014.

* cited by examiner

*Primary Examiner* — Livius R. Cazan
(74) *Attorney, Agent, or Firm* — Oblon, McClelland, Maier & Neustadt, L.L.P.

(57) ABSTRACT

A component mounter for holding a component and for mounting the component on a surface of a board includes a head, a horizontal moving device, a vertical moving device, a mounting control device, and an imaging device. The imaging device is configured to image an imaging target by receiving incident light from the imaging target on an imaging element via an optical system. The optical system includes a first optical system configured to guide incident light from a direction of a side surface of a nozzle tip to a first region of the imaging element, and a second optical system configured to guide incident light from a direction of the surface of the board to a second region of the imaging element. The imaging device is configured to image an image via the first optical system and the second optical system.

11 Claims, 11 Drawing Sheets

COMPONENT MOUNTER

TECHNICAL FIELD

The present application relates to a component mounter that holds a component and mounts it on a surface of a board.

BACKGROUND ART

Conventionally, there are known component mounters of a type that pick up a component with a suction nozzle held on a head and mount the component on the surface of a board, wherein an imaging device is provided on the head (for example, refer to patent literature 1). With this component mounter, a mirror is provided at a position on the light axis of the imaging device, and by rotating the mirror such that the light axis faces up or down it is possible to image a component held by a suction nozzle and to image the board surface with one imaging device.

Patent Literature 1: JP-A-2011-86847

SUMMARY

However, with the above component mounter, because a switching mechanism for switching the imaging device is required, the imaging device is made complex. Also, to acquire an image of a component held by a suction nozzle, or an image of the board surface, or the like, because it is necessary to perform imaging the same number of times as there are images to be acquired, the time required for imaging is long, thereby worsening mounting board production efficiency.

An object of the present disclosure is to provide an imaging device capable of acquiring a side surface of a nozzle tip section and an image of a board surface without making the device complex.

The present disclosure uses the following means to achieve the above object.

A first component mounter of the present disclosure is a component mounter configured to hold a component and mount the component on a surface of a board, the component mounter including:
a head having a nozzle configured to hold the component at a nozzle tip of the nozzle;
a horizontal moving device configured to move the head in a horizontal direction with respect to the surface of the board;
a vertical moving device configured to move the nozzle in a vertical direction with respect to the surface of the board;
a mounting control device configured to perform mounting operation of mounting the component held by the nozzle at a mounting location on the surface of the board by moving the head using the horizontal moving device such that the nozzle is positioned above the mounting position on the surface of the board and lowering the nozzle using the vertical moving device; and
an imaging device provided on the head and configured to image an imaging target by receiving incident light from the imaging target on an imaging element via an optical system, wherein
the optical system includes
a first optical system configured to guide incident light from a direction of a side surface of the nozzle tip to a first region of the imaging element, and
a second optical system configured to guide incident light from a direction of the surface of the board to a second region of the imaging element in a state with the nozzle above the surface of the board, and
the imaging device is configured to be able to image an image of the side surface of the nozzle tip and an image of the surface of the board respectively via the first optical system and the second optical system.

The first component mounter of the present disclosure is provided with an imaging device, provided on the head and configured to image an imaging target object by receiving incident light onto an imaging element from the direction of the imaging target object via an optical system. By providing a first optical system configured to guide incident light from a direction of a side surface of the nozzle tip to a first region of the imaging element, and a second optical system configured to guide incident light from a direction of the surface of the board to a second region of the imaging element in a state with the nozzle above the surface of the board as the optical system, the imaging device is configured to be able to image an image of the side surface of the nozzle tip and an image of the surface of the board respectively via the first optical system and the second optical system. By this, it is possible to acquire a side surface image of a nozzle tip and an image of a board surface with a single imaging device without having a complex configuration. Also, being able to acquire a side surface image of a nozzle tip and an image of a board surface with a single imaging allows imaging time to be shortened, thereby preventing production efficiency from worsening. Further, by using a side surface image of a nozzle tip and an image of a board surface, it is easy to judge whether a component has been mounted correctly on the board surface.

For such a first component mounter of the present disclosure, the head may be a rotary type head provided with multiple nozzles in a circumferential direction and capable of revolving the multiple nozzles in the circumferential direction, the mounting control device may perform mounting operation of mounting the component held by the nozzle at the mounting location on the surface of the board by moving the head using the horizontal moving device such that a mounting target nozzle out of the multiple nozzles is positioned above the mounting position on the surface of the board and lowering the mounting target nozzle using the vertical moving device, and the imaging device may be able to image a first image that is at least one of a side image of the nozzle tip of a pre-mounting nozzle used to perform mounting operation of the component after the mounting target nozzle or a side image of the nozzle tip of a post-mounting nozzle used to perform mounting operation of the component before the mounting target nozzle, and a second image that is an image of surface of the board when the mounting target nozzle is performing mounting operation of the component respectively via the first optical system and the second optical system.

For this form of the first component mounter of the present disclosure, the optical system may include a third optical system configured to guide incident light from a direction of the mounting target nozzle to a third region of the imaging element, and the imaging device may be capable of imaging the first image, the second image, and a third image that is an image of the mounting target nozzle respectively via the first optical system, the second optical system, and the third optical system. Accordingly, it is possible to determine whether a mounting target nozzle is present or absent using the third image.

Also, for the first component mounter of the present disclosure, the following may also be included: an imaging control device configured to control the imaging device such that the image of the surface of the board is imaged at a first timing at which the component held by the nozzle contacts the surface of the board when the nozzle is lowered by the vertical moving device. Accordingly, it is possible judge whether the component was correctly mounted on the board surface based on the image of the board surface imaged at the first timing. For this form of the first component mounter of the present disclosure, the imaging control device may be configured to control the imaging device such that, after the first timing, the side image of the nozzle tip is imaged after performing mounting operation of the component, and further provided may be a determining device configured to determine whether the nozzle correctly mounted the component based on the image of the surface of the board imaged at the first timing and the side image of the nozzle tip imaged after the first timing. Accordingly, it is also possible to judge whether the component remained stuck on the nozzle after the nozzle mounted the component on the board surface.

Further, for the first component mounter of the present disclosure, the following may also be included: an imaging control device configured to control the imaging device such that the image of the surface of the board is imaged at a second timing at which the nozzle has been raised by a specified amount by the vertical moving device after the nozzle has performed mounting operation of the component. Accordingly, it is possible judge whether the component was correctly mounted on the board surface based on the image of the board surface imaged at the second timing. Also, it is possible to judge whether the component remained stuck on the nozzle after the nozzle mounted the component on the board surface. For this form of the first component mounter of the present disclosure, the imaging control device may be configured to control the imaging device such that, before the second timing, the side image of the nozzle tip of the nozzle yet to perform mounting operation of the component is imaged, and further provided may be a determining device configured to determine whether the nozzle correctly mounted the component based on the image of the surface of the board imaged at the second timing and the side image of the nozzle tip imaged before the second timing. Accordingly, it is also possible to judge whether a nozzle is holding a component before performing mounting operation.

A second component mounter of the present disclosure may be configured to hold a component and mount the component on a surface of a board, the component mounter including:

a rotary type head provided with multiple nozzles in a circumferential direction and capable of revolving the multiple nozzles in the circumferential direction, a horizontal moving device configured to move the head in a horizontal direction with respect to the surface of the board;

a vertical moving device configured to move the nozzle in a vertical direction with respect to the surface of the board;

a mounting control device configured to perform mounting operation of mounting the component held by the nozzle at the mounting location on the surface of the board by moving the head using the horizontal moving device such that a mounting target nozzle out of the multiple nozzles is positioned above the mounting position on the surface of the board and lowering the mounting target nozzle using the vertical moving device, and an imaging device provided on the head, wherein the imaging device is able to image at least one of a side image of the nozzle tip of a pre-mounting nozzle used to perform mounting operation of the component after the mounting target nozzle or a side image of the nozzle tip of a post-mounting nozzle used to perform mounting operation of the component before the mounting target nozzle, and an image of surface of the board when the mounting target nozzle is performing mounting operation of the component.

With the second component mounter of the present disclosure, being provided with a rotary type head able to revolve multiple nozzles in a circumferential direction and an imaging device attached to the head, it is possible to make the imaging device image a side surface image of the nozzle tip before mounting of the nozzle to perform mounting after the mounting target nozzle, a side surface image of the nozzle tip after mounting of the nozzle that mounted a component before the mounting target nozzle, and an image of the board surface on which the mounting target nozzle mounts the component. Accordingly, by using at least one of a side surface image of a nozzle tip before mounting and a side surface image of a nozzle tip after mounting, and an image of the board surface when the mounting target nozzle performs mounting operation of the component, it is easy to judge whether the component has been correctly mounted on the board surface.

DESCRIPTION OF EMBODIMENTS

Figure 1:
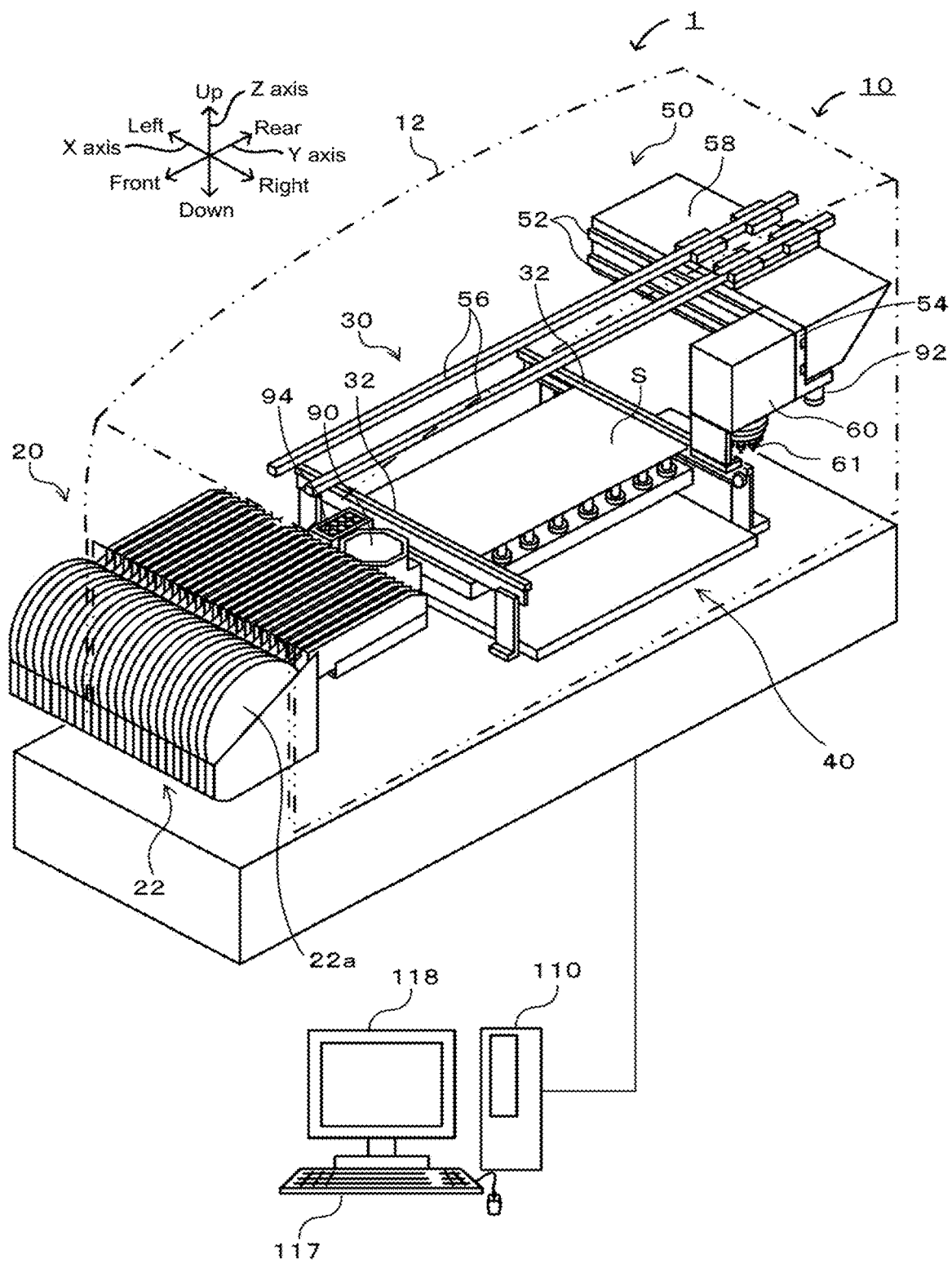
FIG. 1 shows the overall configuration of component mounting system 1.
Figure 2:
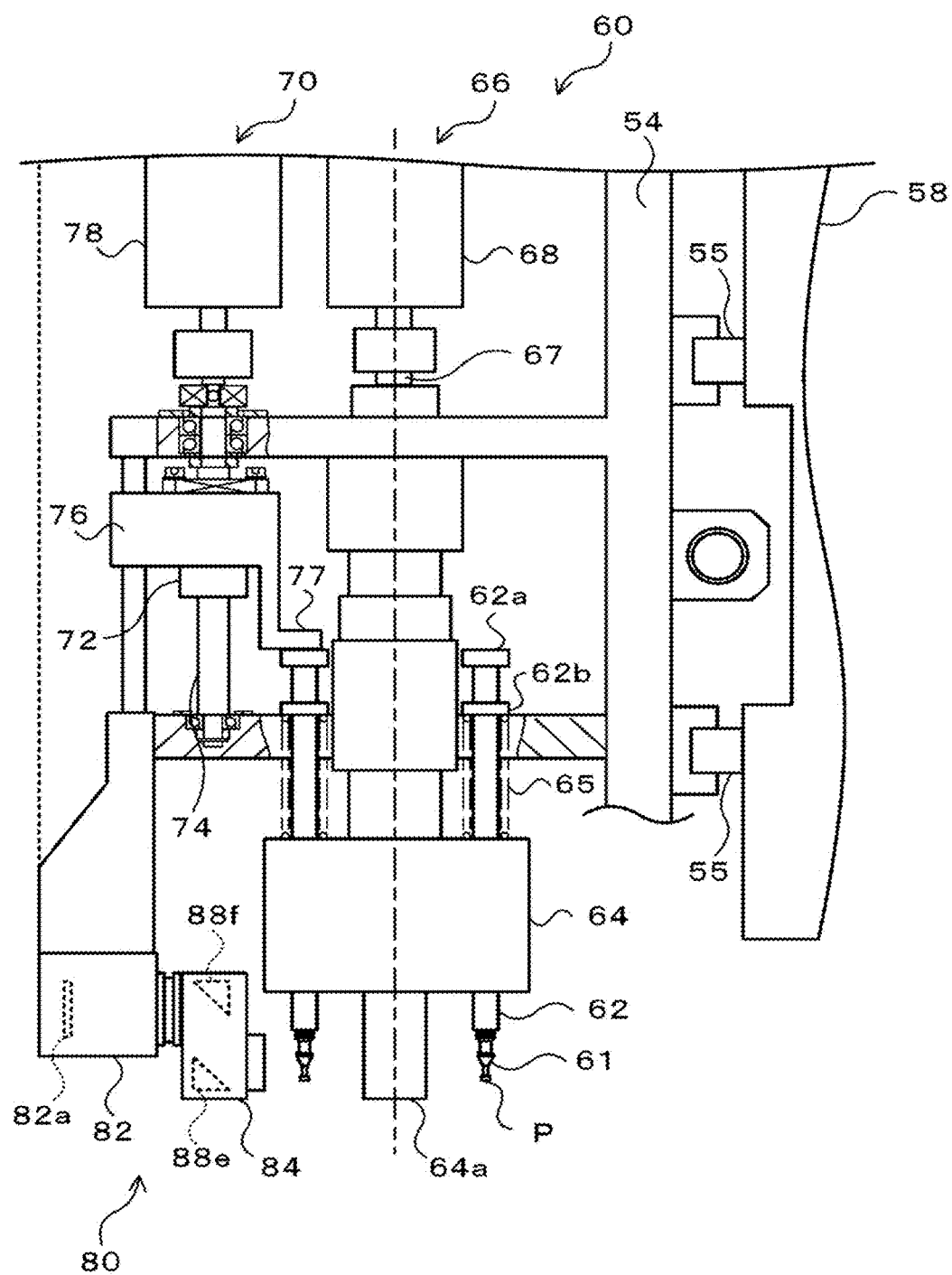
FIG. 2 shows the overall configuration of head unit 60.
Figure 3:
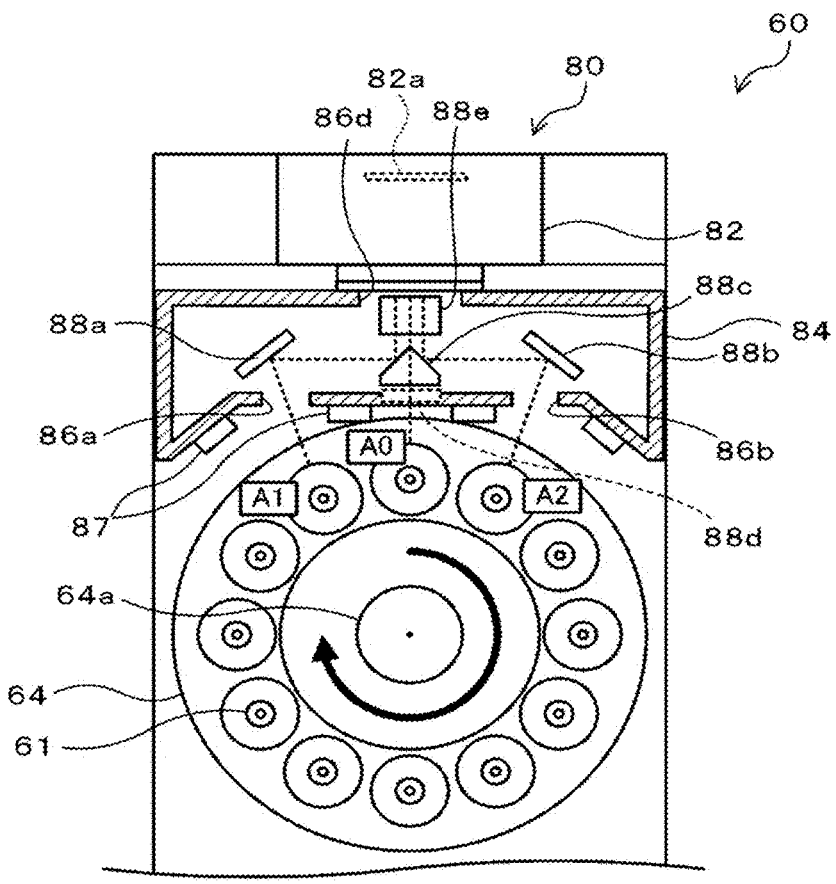
FIG. 3 shows the overall configuration of rotary head 64 and side surface camera 80.
Figure 4:
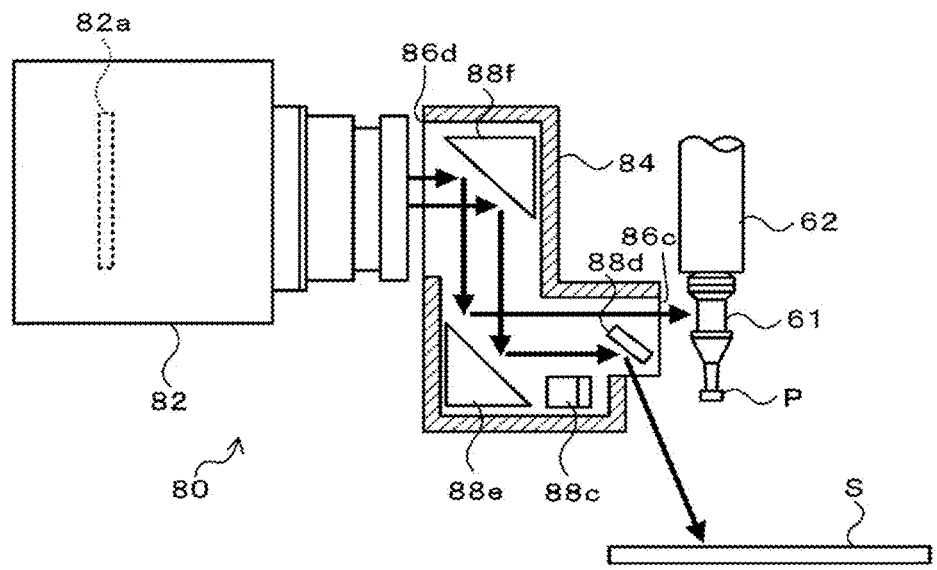
FIG. 4 shows the overall configuration of side surface camera 80 and optical system 84.
Figure 5:
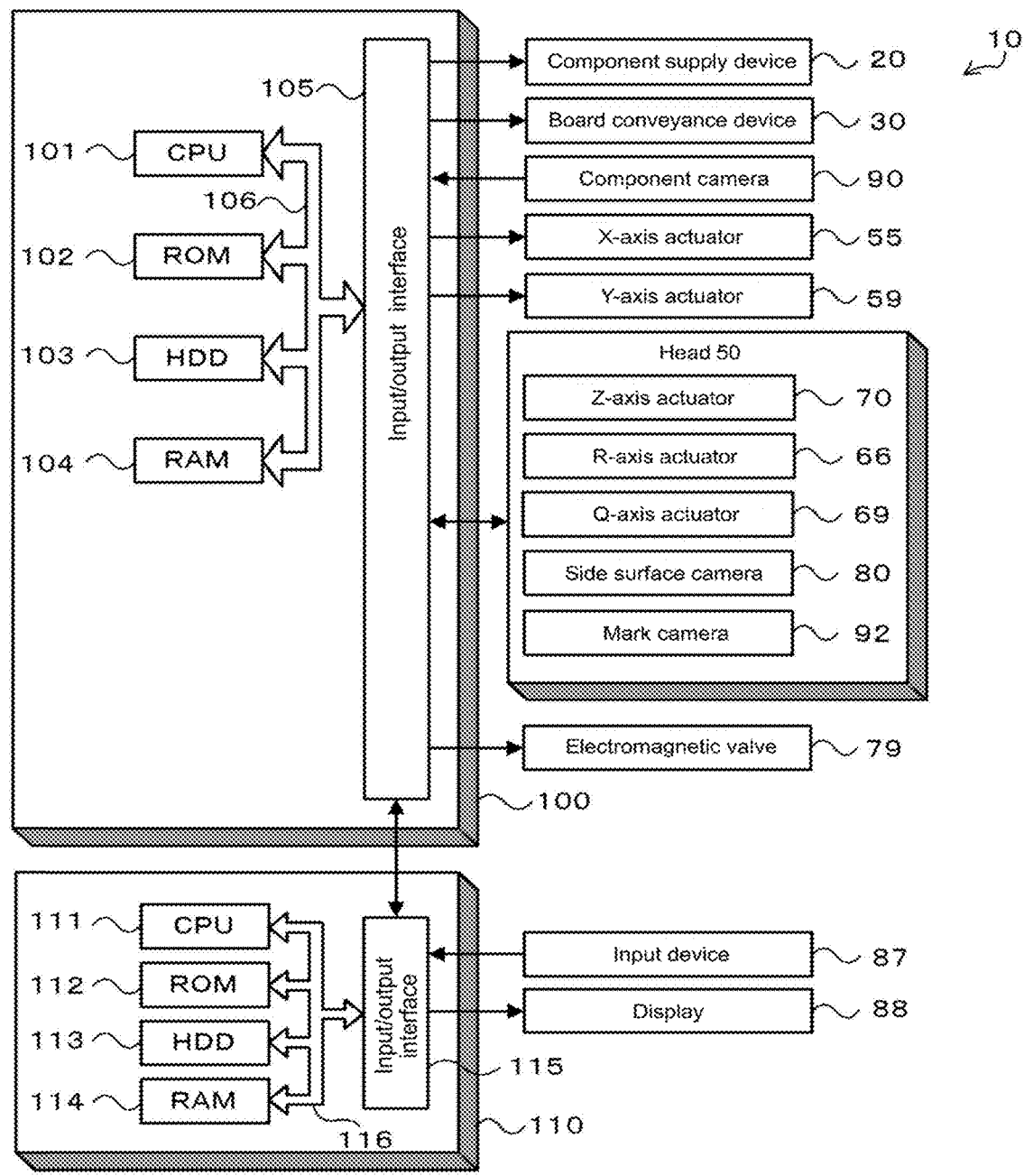
FIG. 5 is a block diagram showing electrical connections of control device 100 and management device 110.

Embodiments of the present disclosure are described below using the figures. FIG. 1 shows the overall configuration of component mounting system 10. FIG. 2 shows the overall configuration of head unit 60; FIG. 3 shows the overall configuration of rotary head 64 and side surface camera; FIG. 4 shows the overall configuration of side surface camera 80 and optical system 84; and FIG. 5 is a block diagram showing electrical connections of control device 100 and management device 110.

Component mounting system 1 is provided with component mounter 10 that mounts electronic component (hereinafter "component") P on circuit board (hereinafter "board") S, and management device 110 that performs overall system management. Note that, for the present embodiment, in FIG. 1, the left/right direction is the X-axis direction, the front/rear direction is the Y-axis direction, and the up/down direction is the Z-axis direction.

As shown in FIG. 1, component mounter 10 is provided with component supply device 20 provided with reels or trays that store components P, board conveyance device 30 that conveys board S, backup device 40 that backs up the conveyed board S, head unit 60 that picks up component P with suction nozzle 61 and mounts component P on board S, XY robot 50 that moves head unit 60 in the XY directions, and control device 100 (refer to FIG. 5) that controls the mounter overall. Board conveyance device 30, backup device 40, XY robot 50, and head unit 60 are accommodated in housing 12. Further, component mounter 10 is also provided with items such as component camera 90 for imaging from below the pickup orientation of component P picked up by suction nozzle 61, mark camera 92 for imaging from above board positioning reference marks provided on board S, and nozzle stocker 94 that stocks multiple types of suction nozzles 61 to be exchanged to match the size of the component P being mounted.

As shown in FIG. 1, component supply device 20 is provided with tape feeders 22 removably attached to the front side of housing 12. Tape feeder 22 is provided with reel 22a on which is wound tape that stores components P at a specified interval, with components P being fed to a component supply position by the tape being pulled from reel 22a by the driving of a drive motor, which is not shown.

As shown in FIG. 1, board conveyance device 30 is provided with belt conveyor device 32, and board S is conveyed from the left to the right in FIG. 1 (board conveyance direction) by the driving of belt conveyor device 32. Backup device 40 that supports conveyed board S from beneath is provided in a central portion of board conveyance device 30 in the board conveyance direction (X-axis direction).

As shown in FIG. 1, XY robot 50 is provided with guide rails 56 provided on an upper section of the device and extending in the Y-axis direction, Y-axis slider 58 that is able to move along guide rails 56, guide rails 52 provided on a side surface of Y-axis slider 58 and extending in the X-axis direction, and X-axis slider 54, to which head unit 60 is attached, that is able to move along guide rails 52.

As shown in FIG. 2, head unit 60 is provided with rotary head 64 on which multiple nozzle holders 62 that each hold suction nozzle 61 are arranged at a specified angle interval (for example, 30 degrees) on a circumference of a rotation axis, R-axis actuator 66 that rotates rotary head 64, Z-axis actuator 70 that moves nozzle holders 60 in the Z-axis direction, and side surface camera 80 that is able to image suction nozzle 61, a side surface of component P picked up by suction nozzle 61, and a surface of board S.

Nozzle holder 62 is configured from a hollow cylindrical member that extends in the Z-axis direction. Upper end section 62a of nozzle holder 62 is formed as a cylinder with a diameter larger than the shaft section of nozzle holder 62. Also, flange section 62b with a diameter larger than the shaft section is formed on nozzle holder 62 at a specified position lower than upper end section 62a. Spring (coil spring) 65 is arranged between the circular surface of the bottom of flange section 62b and a cavity, which is not shown, formed in the upper surface of rotary head 64. Thus, spring 65 engaged in the cavity on the upper surface of rotary head 64 biases nozzle holder 62 (flange section 62b) upwards.

As shown in FIG. 3, with rotary head 64, multiple (for example, twelve) suction nozzles 61 are attached to the nozzle holders 62 (refer to FIG. 2) arranged in the circumferential direction. Also, cylindrical reflective body 64a capable of reflecting light is attached to the center of the lower surface of rotary head 64. Note that, rotary head 64 of the present embodiment is provided internally with Q-axis actuator 69 (refer to FIG. 5) that individually rotates each nozzle holder 62. Although not shown in the figures, Q-axis actuator 69 is provided with a drive gear that engages with gears provided on the outer cylindrical of nozzle holders 62, and a drive motor that is connected to a rotation shaft of the drive gear. Thus, with the present embodiment, multiple nozzle holders 62 are each able to be rotated around an axis (Q direction), meaning that each suction nozzle 61 is also able to be rotated individually.

As shown in FIG. 2, R-axis actuator 66 is provided with rotation shaft 67 connected to rotary head 64, and drive motor 68 connected to rotation shaft 67. R-axis actuator 66 intermittently rotates rotary head 64 by a fixed angle each time by intermittently driving drive motor 68 by a specified angle (for example, 30 degrees). By this, each suction nozzle 61 arranged on rotary head 64 is revolved by a specified angle each time in a circumferential direction. Here, suction nozzle 61, when positioned at the 12 o'clock position of FIG. 3 from among the multiple positions to which suction nozzle 61 can be moved, picks up component P supplied to the component supply position from component supply device 20 and performs mounting of component P on board S. Therefore, the 12 o'clock position is referred to as mounting position A0. Also, the position at 11 o'clock in FIG. 3 is one position before (directly before) mounting position A0 as suction nozzle 61 moves in the circumferential direction (shown by the arrow in the figure) and is referred to as pre-mounting position A1; the position at 1 o'clock in FIG. 3 is one position after (directly after) mounting position A0 as suction nozzle 61 moves in the circumferential direction (shown by the arrow in the figure) and is referred to as post-mounting position A2.

As shown in FIG. 2, Z-axis actuator 70 is configured as a feed screw mechanism provided with screw shaft 74 extending in the Z-axis direction on which ball screw but 72 moves, Z-axis slider 76 attached to ball screw nut 72, and drive motor 78 the rotation shaft of which is connected to screw shaft 74. Z-axis actuator 70 moves Z-axis slider 76 in the Z-axis direction by the rotation of drive motor 78. Roughly L-shaped lever section 77 projecting to the rotary head 64 side is formed on Z-axis slider 76. Lever section 77 is able to contact upper end section 62a of a nozzle holder 62 positioned in a specified range that includes mounting position P0. Therefore, when lever section 77 is moved in the Z-axis direction with the movement in the Z-axis direction of Z-axis slider 76, it is possible to move the nozzle holder 62 (suction nozzle 61) positioned in the specified range in the Z-axis direction.

As shown in FIGS. 3 and 4, side surface camera 80 is provided with camera main body 82 that is provided on a lower section of head unit 60 and that has built-in imaging element 82a such as a CCD or CMOS, and optical system 84 that forms an image on imaging element 82a. Optical system 84 is formed with three incident openings on the rotary head 64 side: left incident opening 86a, right incident opening 86b, and upper incident opening 86c; and camera connection opening 86*d* is formed on the camera main body 82 side. Note that, upper incident opening 86*c* is formed at a position facing the base section of suction nozzle 51 positioned at mounting position A0, left incident opening 86*a* is formed at a position facing a tip section of suction nozzle 51 positioned at pre-mounting position A1, and right incident opening 86*b* is formed at a position facing the tip section of suction nozzle 51 positioned at post-mounting position A2. Also, optical system 84 has multiple light emitting bodies 87, such as LEDs, that emit light towards reflective body 64*a* of rotary head 64 provided on an outer circumference on the rotary head 64 side. Provided inside optical system 84 are multiple mirrors (left mirror 88*a*, right mirror 88*b*, middle mirror 88*c*, upper mirror 88*d*, rear mirrors 88*e* and 88*f*) that reflect and guide light from each of incident openings 86*a*, 86*b*, and 86*c* onto imaging element 82*a*. Left mirror 88*a* is arranged at left incident opening 86*a* and reflects light that enters from left incident opening 86*a* onto middle mirror 88*c*; right mirror 88*b* is arranged at right incident opening 86*b* and reflects light that enters from right incident opening 86*b* onto middle mirror 88*c*. Further, middle mirror 88*c* is arranged between left mirror 88*a* and right mirror 88*b*, and reflects light from left mirror 88*a* to the lower left region of rear mirror 88*e* and reflects light from right mirror 88*b* to the upper right region of rear mirror 88*e*. Also, upper mirror 88*d* is arranged at upper incident opening 86*c* and reflects light that arrives from a direction approximately 45 degrees with respect to board S to a central region of rear mirror 88*e*. And, upper incident opening 86*c* is open at a region of rear mirror 88*e* further up than the region that receives light from upper mirror 88*d*, such that light from the upper section of upper mirror 88*d* directly reaches an upper region of rear mirror 88*e*. Rear mirrors 88*e* and 88*f* reflect light that reaches rear mirror 88*e* in parallel towards imaging element 82*a*. Thanks to the above, light from the direction of suction nozzle 61 positioned at pre-mounting position A1 enters left incident opening 86*a*, and is reflected by left mirror 88*a*, middle mirror 88*c*, and rear mirrors 88*e* and 88*f* (first optical system) to reach first region A of imaging element 82*a*. Light from the direction of suction nozzle 61 positioned at post-mounting position A2 enters right incident opening 86*b*, and is reflected by right mirror 88*b*, middle mirror 88*c*, and rear mirrors 88*e* and 88*f* (first optical system) to reach first region B of imaging element 82*a*. Light from a direction of a 45 degree angle below suction nozzle 61 is reflected by upper mirror 88*d* and rear mirrors 88*e* and 88*f* (second optical system) to reach a second region of imaging element 82*a*. Light from the direction of suction nozzle 61 positioned at mounting position A0 enters upper incident opening 86*c*, arrives directly at rear mirror 88*e*, and is reflected by rear mirrors 88*e* and 88*f* (third optical system) to reach a third region of imaging element 82*a*. By this, images from different directions are formed on different regions of imaging element 82*a*.

Figure 6:
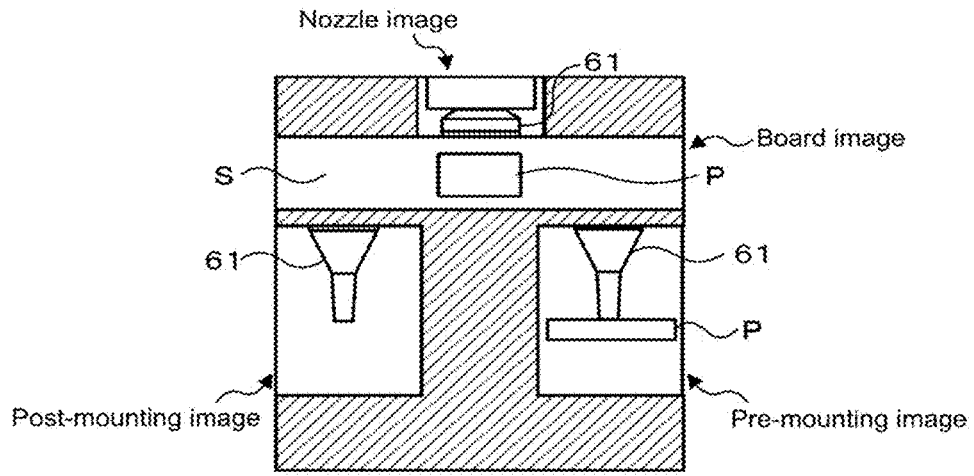
FIG. 6 illustrates an example of an image obtained by imaging of side surface camera 80.

In this manner, side surface camera 80, with a single imaging operation, is able to image suction nozzle 61 (nozzle imaging area) at mounting position A0, suction nozzle 61 (pre-mounting imaging area) at pre-mounting position A1, and suction nozzle 61 (post-mounting imaging area) at post-mounting position A2, and acquire respective images of each. Further, by imaging with side surface camera 80 with suction nozzle 61 at mounting position A0 positioned above board S, in addition to the above three images, it is also possible to acquire an image of the surface of board S (board imaging area). FIG. 6 is an example of an image acquired by imaging using side surface camera 80.

FIG. 6 shows a side surface image (hereinafter referred to as a post-mounting image) of the tip of suction nozzle 61 positioned at post-mounting position A2 directly after suction nozzle 61 has mounted component P on board S, a side surface image (hereinafter referred to as a pre-mounting image) of the tip of suction nozzle 61 positioned at pre-mounting position A1 directly before suction nozzle 61 mounts component P, a side surface image (hereinafter referred to as a nozzle image) of the base section of suction nozzle at mounting position A0, and an image of board S (hereinafter referred to as a board image).

As shown in FIG. 5, control device 100 is configured from CPU 101 that is based around a microprocessor, and is also provided with items such as ROM 102, HDD 103, RAM 104, and input/output interface 105. These items are connected by bus 106. Control device 100 receives image signals and so on from side surface camera 80, component camera 90, and mark camera 92 via input/output interface 105. Note that, X-axis slider 54, Y-axis slider 58, Z-axis actuator 70, Q-axis actuator 69, and R-axis actuator 66 are each provided with a position sensor, not shown, and position information from these position sensors is also entered into control device 100. Also, control device 100 outputs drive signals and so on to component supply device 20 and board conveyance device 30, backup device 40, X-axis actuator 55 that moves X-axis slider 54, Y-axis actuator 59 that moves Y-axis slider 58, Z-axis actuator 70 (drive motor 78), Q-axis actuator 69 (drive motor), R-axis actuator 66 (drive motor 68), electromagnetic valve 79 that performs switching to and from connecting and blocking a vacuum pump, which is not shown, and suction nozzle 61, via input/output interface 105.

Management device 110 is, for example, a multipurpose computer. As shown in FIG. 5, management computer 110 is provided with items such as CPU 111, ROM 112, HDD on which is memorized board production data and so on, RAM 114, and input/output interface 115. These items are connected by bus 116. Management computer 110 receives input signals from input device 117 such as a mouse or keyboard via input/output interface 115. Also, management device 110 outputs an image signal to display 118 via input/output interface 115. Here, board production data is data that defines which components should be mounted on the board and in what order by component mounter 10, along with how many boards S mounted with components P in this manner are to be manufactured, and so on. Production data is entered in advance by an operator and is sent from management device 110 to component mounter 10 when production is started.

Figure 7:
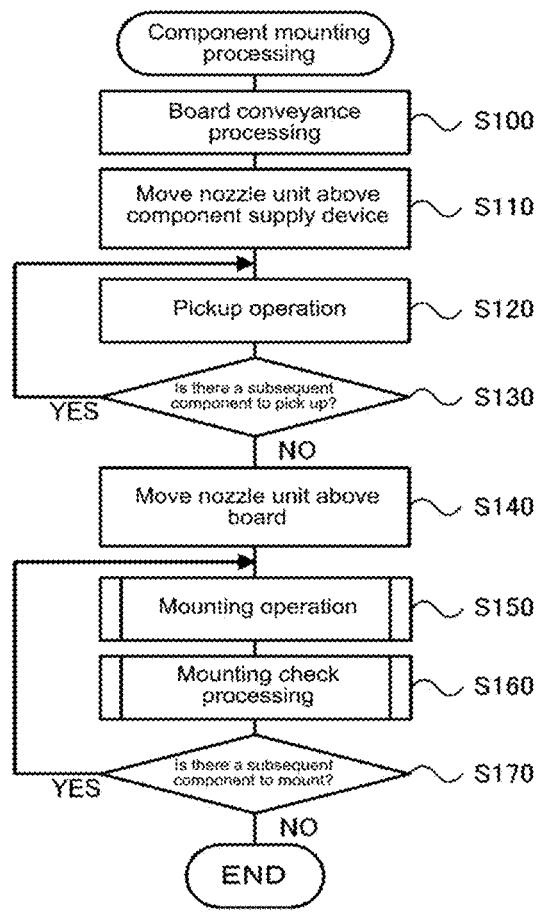
FIG. 7 is a flowchart showing an example of component mounting processing performed by CPU 101 of control device 100.

Next, operation of component mounter 10 figured as given above is described in detail. FIG. 7 is a flowchart showing an example of component mounting processing performed by CPU 101 of control device 100. This processing is performed when production data is received from management device 110 and an instruction to start production is given.

During component mounting processing, CPU 101 of control device 100, first, performs board conveyance processing of controlling board conveyance device 30 to convey board S (S100). Continuing, CPU 101 performs pickup operation (S120) by controlling X-axis actuator 55 and Y-axis actuator 59 such that mounting position A0 of rotary head 64 is moved to the component supply position of component supply device 20 (S110), controlling R-axis actuator 66 and Z-axis actuator 70 such that suction nozzle 61 at pre-mounting position A1 is lowered while being revolved to mounting position A0, and controlling electromagnetic valve 79 such that negative pressure is supplied to suction nozzle 61 and suction nozzle 61 picks up component P. CPU 101, when pickup operation has been performed, determines whether there is a component P to be picked up next (S130). Then, CPU 101, when judging that there is a component P to be picked up next, returns to S120, repeats pickup operation, and when judging that there is no component P to pick up next, proceeds to processing of S140.

Then, CPU 101 controls X-axis actuator 55 and Y-axis actuator 59 such that mounting position A0 of rotary head 64 is directly above the mounting position of board S, so as to move head unit 60 above board S (S140). Note that, movement of head unit 06 is performed passing over component camera 90. When head unit 60 passes over component camera 90, component P being held by suction nozzle 61 is imaged by component camera 90, and a position deviation of component P with respect to suction nozzle 61 is detected based on the acquired image.

When head unit 60 is moved to the mounting position, CPU 101 performs mounting operation of mounting component P on board S (S150), and performs mounting check processing that checks whether mounting operation was performed correctly (S160). Then, CPU 101 determines whether there is a component P to be mounted next (S170), and when determining that there is a component P to be mounted next, returns to S150 and repeats mounting operation and mounting check operation, and when determining that there is no component P to be mounted next, ends component mounting processing.

Figure 8:
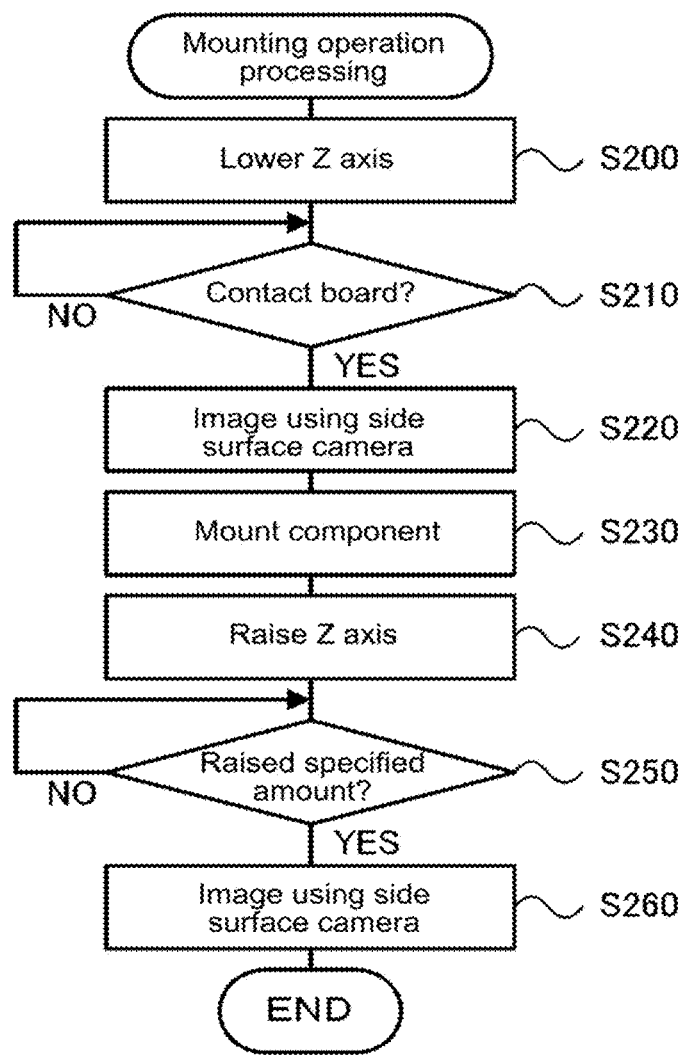
FIG. 8 is a flowchart showing an example of mounting operation processing performed by CPU 101 of control device 100.

Mounting operation of S150 is performed by performing mounting operation processing of FIG. 8. With the mounting operation processing of FIG. 8, CPU 101 controls R-axis actuator 66 and Z-axis actuator 70 such that suction nozzle 61 at pre-mounting position A1 is lowered while being revolved to mounting position A0 (S200), and waits for component P being held by suction nozzle 61 to contact board S (S210). Note that, the judgment of S210 may be, for example, performed based on a detection value from a position sensor attached to Z-axis actuator 70. CPU 101, when judging that component P has contacted board S, performs imaging using side surface camera 80 (S220), and controls electromagnetic valve 79 to apply positive pressure to suction nozzle 61 such that component P is mounted on board S (S230). Here, included in the image obtained by the imaging of side surface camera 80 are a side surface image (nozzle image) of suction nozzle 61 at mounting position A0, a side surface image (pre-mounting image) of suction nozzle 61 at pre-mounting position A1, a side surface image (post-mounting image) of suction nozzle 61 at post-mounting position A2, and a surface image at the mounting position of board S (board image). Then, CPU 101 controls Z-axis actuator 70 such that suction nozzle 61 raises (S240), and waits until suction nozzle 61 has been raised in the Z-axis by a specified amount (for example, 1 mm) (S250). Here, during processing of S240, suction nozzle 61 is only moved in the Z-axis direction, not in the X-axis, Y-axis, or R-axis directions. Also, the judgment of S250, for example, may be performed based on a detection value from a position sensor attached to Z-axis actuator 70. When suction nozzle 61 has been raised by the specified amount in the Z-axis direction, CPU 101 performs imaging using side surface camera 80 (S260) and then ends mounting operation processing. Note that, CPU 101, after imaging using side surface camera 80, performs mounting check processing as described below, and if it is confirmed that no mounting errors occurred during mounting check processing, to perform mounting operation of the next component P, CPU 101 starts movement in the X-axis, Y-axis, and R-axis directions.

Figure 9:
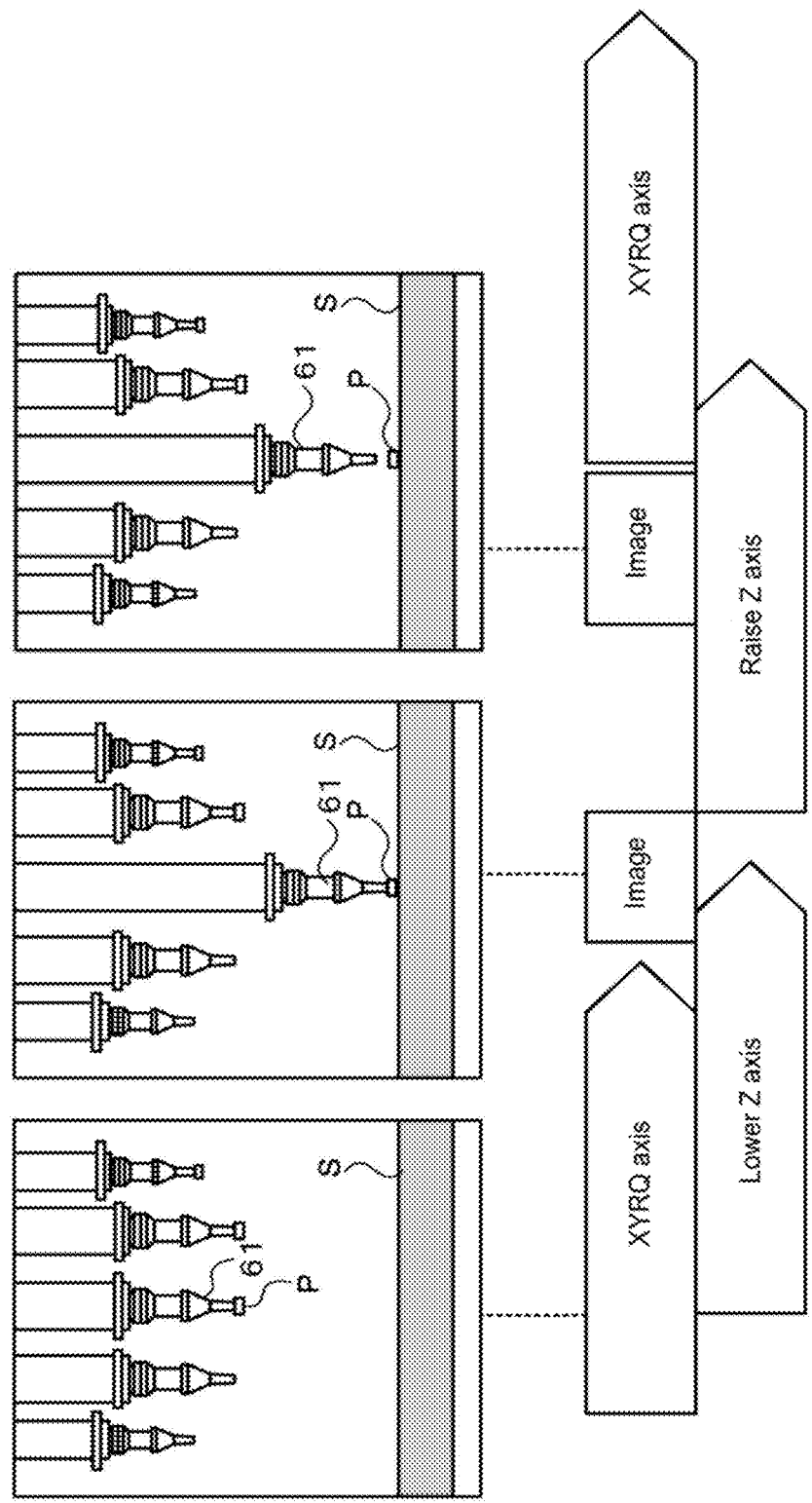
FIG. 9 illustrates imaging timing of side surface camera 80 of an embodiment.
Figure 10:
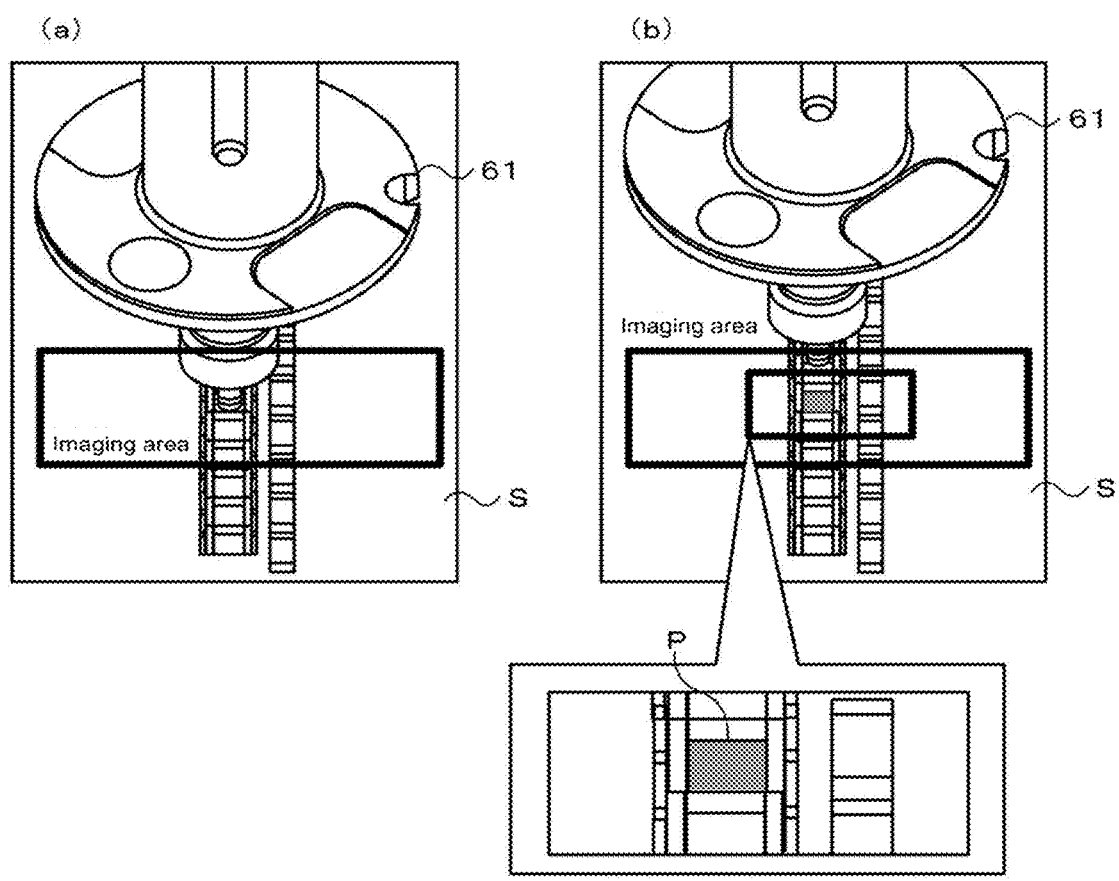
FIG. 10 illustrates states of suction nozzle 61 and board S at the imaging timing of FIG. 9.

FIG. 9 illustrates imaging timing of side surface camera 80 in the embodiment; FIG. 10 shows states of suction nozzle 61 and board S at timings from FIG. 9. As shown, imaging by side surface camera 80 is performed at a first timing at which component P being held by suction nozzle 61 contacts board S, and at a second timing at which suction nozzle 61 has been raised in the Z-axis direction by a specified amount. The image obtained by imaging by side surface camera 80 at the first timing, as shown in the imaging area (board imaging area) of FIG. 10(a), is an image from diagonally above of a state of component P being held by suction nozzle 61 contacting board S. Also, the image obtained by imaging by side surface camera 80 at the second timing, as shown in the imaging area (board imaging area) of FIG. 10(b), is an image from diagonally above of a state after mounting of component P with suction nozzle 61 separated from board S.

Figure 11:
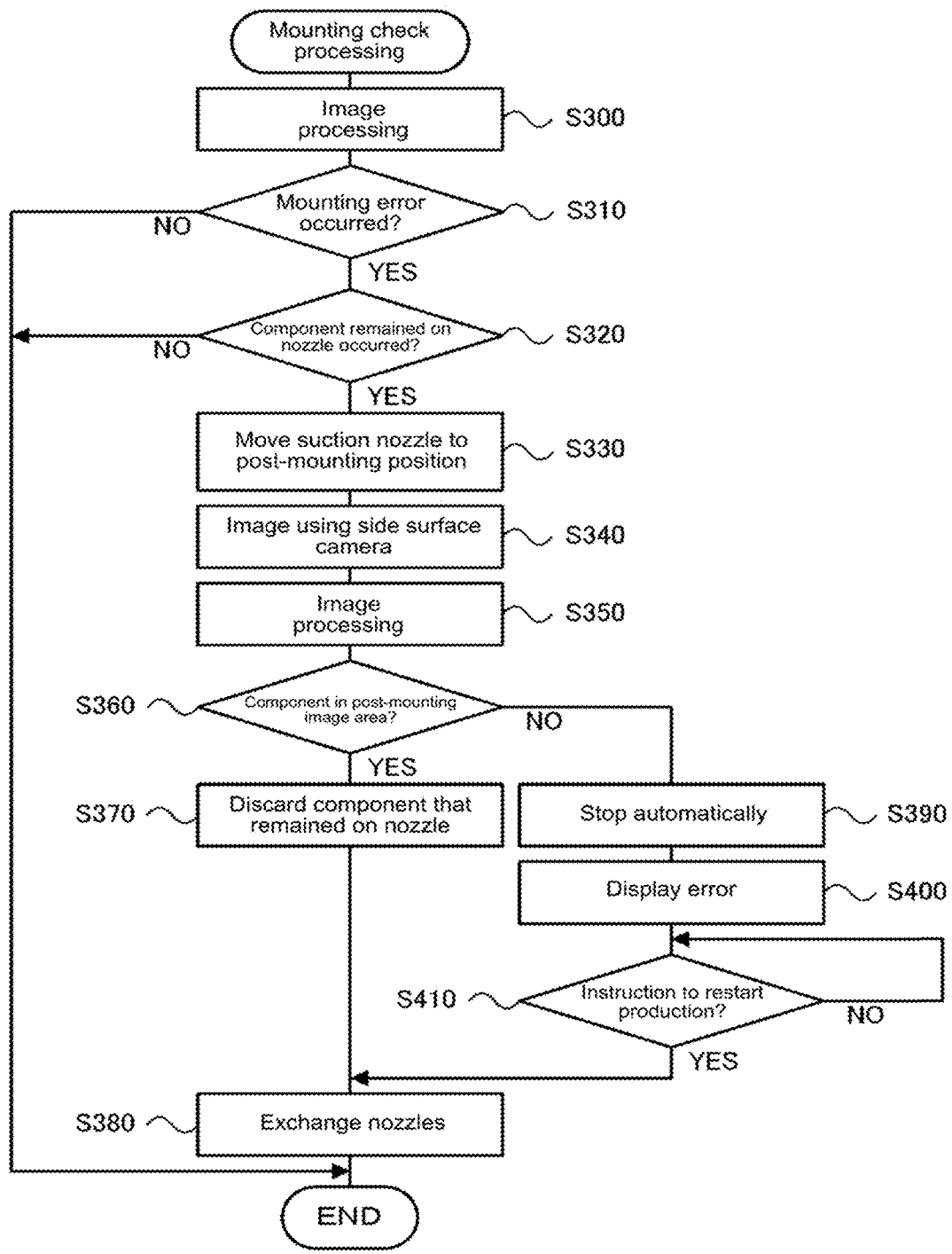
FIG. 11 is a flowchart showing an example of mounting check processing performed by CPU 101 of control device 100.

Mounting check processing of S160 is performed by performing mounting check processing of FIG. 11. With mounting check processing of FIG. 11, CPU 101 of control device 100, first, performs mounting checking of component P by image processing the images obtained by imaging using side surface camera 80 at each of the first timing and the second timing (S300). Here, the processing of S300 extracts a board image (refer to FIG. 10[a]) within the board imaging area from the image obtained by imaging at the first timing, and determines whether component P is at the mounting position by checking the brightness values of pixels corresponding to the mounting position among the extracted board image. By this, it is possible to determine whether position deviation (mounting error) has occurred for the placed component P with respect to the mounting position of board S. Also, the processing of S300 extracts a board image (refer to FIG. 10[b]) within the board imaging area from the image obtained by imaging at the second timing, and by comparing the extracted board image to the board image obtained by imaging at the first timing and determining differences between the images, determines whether the mounting position of component P on board S changed. By this, it is possible to determine whether an error of component P remaining stuck to suction nozzle 61 (mounting error) after mounting of component P occurred. Here, the determination of differences between the image from the first timing and the image from the second timing may be performed with reference to suction nozzle 61 that appears in both images, or may be performed with reference to an estimated mounting position obtained by estimating the mounting position of component P based on surrounding portions and solder that appears in both images. Further, an operator may select from these references. Let us consider a case in which warpage occurs in board S. In this case, because board S is imaged in a state with component P being pushed against board S by suction nozzle 61 (the case at the first timing), and then, after mounting operation is complete and suction nozzle 61 is raised, board S is imaged in a state in which pushing by suction nozzle 61 no longer occurs (the state at the second timing), the imaging position of board S is deviated. In this case, it is possible to correctly recognize the position of component P by determining differences in the images with reference to the mounting position of component P identified based on surrounding portions and solder that appears in both images.

Also, in the embodiment, the processing of S300 extracts a pre-mounting image within the pre-mounting image area from the image, and determines whether component P is being held by the suction nozzle 61 positioned at pre-mounting position A1 by checking the brightness values of pixels around the tip of the suction nozzle 61 among the extracted pre-mounting image. As described above, the determination of whether component P remained on the suction nozzle is performed by comparing the image (board image) from the first timing and the image (board image) from the second timing. In this case, by checking whether component P is being held by the suction nozzle 61 positioned at pre-mounting position A1 (that is, component P is present) based on the image (pre-mounting image), it is possible to determine whether component P remained on the suction nozzle by a simple comparison of the image (board image) from the first timing and the image (board image) from the second timing obtained when performing mounting operation in which the suction nozzle 61 positioned at pre-mounting position A1 moves to mounting position A0. That is, in a case in which there is no component P being held by the suction nozzle P positioned at pre-mounting position A1, no change arises between the image (board image) from the first timing and the image (board image) from the second timing obtained when performing mounting operation of moving to mounting position A0, and it is not possible to determine whether component P remained on the suction nozzle with a simple comparison. Therefore, in a case in which it is unclear whether a component P is present on the suction nozzle 61 positioned at the pre-mounting position, it is necessary to perform processing to recognize (recognition processing) component P within the image (board image) from the first timing. Such recognition processing makes image processing complex, and may lead to mis-recognition, so is undesirable. In the present embodiment, by checking whether component P is being held by the suction nozzle 61 positioned at pre-mounting position A1 based on the image (pre-mounting image) and then determining whether component P remained on the suction nozzle by a simple comparison of the image (board image) from the first timing and the image (board image) from the second timing obtained when performing mounting operation in which the suction nozzle 61 positioned at pre-mounting position A1 moves to mounting position A0, it is possible to simply and reliably perform a determination as to whether the component P remained on the suction nozzle.

And, CPU 101, when determining whether a mounting error occurred based on the above processing (S310), if determining that a mounting error did not occur, ends mounting check processing. Conversely, CPU 101, if determining that a mounting error occurred, determines whether the mounting error was an error of component P remaining on the suction nozzle (S320). CPU 101, when determining that the mounting error was not an error of component P remaining on the suction nozzle, ends mounting check processing. In this case, discard processing may be performed on the board S with the mounting error (mounting position deviation) after inspection is performed by an inspection device, not shown, at a later process. Note that, CPU 101, after ending mounting check processing, by ending the component mounting processing of FIG. 7, does not have to perform mounting of subsequent components P on board S for which the mounting error occurred.

On the other hand, CPU 101, when determining that the mounting error was an error of component P remaining on the nozzle, after moving the suction nozzle 61 that performed mounting operation of component P from mounting position A0 to post-mounting position A2 (S330), performs imaging using the side surface camera (S340), and performs image processing on the image obtained by the imaging (S350). Processing of S350 extracts a post-mounting image within the post-mounting image area from the image, and determines whether there is a component P (a component remaining on the suction nozzle) on the suction nozzle 61 positioned at post-mounting position A2 by checking the brightness values of pixels around the tip of the suction nozzle 61 of the extracted post-mounting image. CPU 101, when determining that there is a component remaining on the suction nozzle in the post-mounting image area (S360), discards the component P in a discard box that is not shown (S370). Then, CPU 101 exchanges the suction nozzle 61 for a new nozzle for mounting the next component P (S380) and then ends mounting check processing. Note that, CPU 101, after exchanging suction nozzle 61 for a new nozzle, performs imaging using side surface camera 80, extracts a nozzle image within the nozzle imaging area from the obtained image, and determines whether the suction nozzle 61 is attached based on the extracted nozzle image. By this, it is possible to determine whether the suction nozzle 61 has been exchanged. After exchanging suction nozzle 61 and ending mounting check processing, CPU 101 returns to S170 of the component mounting processing of FIG. 7 and proceeds with processing, so as to continue mounting of the next component P.

CPU 101, when determining in S360 that there is no component remaining on the suction nozzle in the post-mounting image area, determines that there is a possibility that component P has fallen on board S, therefore automatically stops component mounter 10 (S390), and displays an error for instructing an operator to remove the component P (S400). Then, CPU 101 stands by until an instruction to restart production is received from an operator (S410), and when an instruction to restart production is received, to restart component mounting processing, exchanges the suction nozzle 61 for a new nozzle (S380), and ends mounting check processing. Note that, CPU 101, in addition to displaying the error of S400, as well as ending mounting check processing, after ending mounting check processing, by ending the component mounting processing of FIG. 7, does not have to perform mounting of subsequent components P on board S for which the error of the component remaining on the suction nozzle occurred. In this case too, discard processing may be performed on the board S with the error of a component remaining on the suction nozzle after inspection is performed by an inspection device, not shown, at a later process.

Here, mounting check processing of FIG. 11 is performed in cases of mounting a small component with a size smaller than a specified size. Mounting of component P is performed by pushing the component P being held by suction nozzle 61 onto solder paste printed on board S, and then applying positive air pressure to component P via suction nozzle 61. Therefore, if component P is small, the solder paste rises up as component P is pushed down, and solder may stick to suction nozzle 61. On the other hand, suction nozzles 61 are selected to match the size of the component P to be mounted. When mounting small components, the internal diameter of the selected suction nozzle 61 is smaller, so the positive air pressure is smaller. Therefore, if solder sticks to the suction opening of the suction nozzle 61, the adhesive power of the solder is stronger than the positive air pressure from the suction nozzle 61, and the Z axis may be raised with the component P stuck to the suction nozzle 61 (that is, the component P may remain on the suction nozzle). Conversely, when mounting large components, the internal diameter of the selected suction nozzle 61 is large, so the positive air pressure is larger. Also, because the component is larger, the contact strength with the board S when component P is pushed against the solder paste is also larger, and the component is thicker, so the amount that the solder rises up when the component P is pushed against the solder paste is less. Thus, when mounting a large component, the possibility of solder getting stuck to the suction nozzle is small, and even if solder does get stuck on the suction nozzle 61, there is virtually no possibility that the component will remain on the suction nozzle. This is why mounting check processing is performed in cases of mounting small components with a size smaller than a specified size.

Component mounter 10 of the embodiment described above is provided with side surface camera 80 on head unit 60, and, as optical system 84 of side surface camera 80, is provided with multiple mirrors 88a to 88f for performing imaging at the same time of suction nozzle 61 at pre-mounting position A1, suction nozzle 61 at post-mounting position A2, and the surface (mounting position) of board S when the suction nozzle 61 positioned at mounting position A0 mounts component P on board S. By this, compared to imaging multiple positions using separate cameras, the device can be made simpler and smaller. Also, because the pre-mounting image, post-mounting image, and board image are acquired with a single imaging, the imaging time is reduced.

Also, component mounter 10 of the present embodiment performs imaging using side surface camera 80 at a first timing at which component P contacts board S by the suction nozzle 61 at mounting position A0 being lowered in the Z-axis direction, and at a second timing at which the suction nozzle 61 has been raised by a specified amount after mounting the component P. By this, in addition to determining whether component P has been mounted at the correct mounting position on board S, it is possible to determine whether the component P remained on the suction nozzle 61 after the mounting of component P, the state being grasped more reliably based on the mounting error state.

Further, component mounter 10 of the present embodiment is able to determine whether there is a suction nozzle 61 at mounting position A0 from also imaging the nozzle imaging area of mounting position A0 with side surface camera 80. By this, in particular, it is possible to determine whether a suction nozzle 61 is attached when exchanging suction nozzles 61.

Component mounter 10 of the present embodiment, during the mounting check processing of FIG. 11, when determining that component P remained on the suction nozzle 61 in S320, moves the suction nozzle 61 to post-mounting position A2, and performs imaging using side surface camera 80, but the imaging may be omitted.

Figure 12:
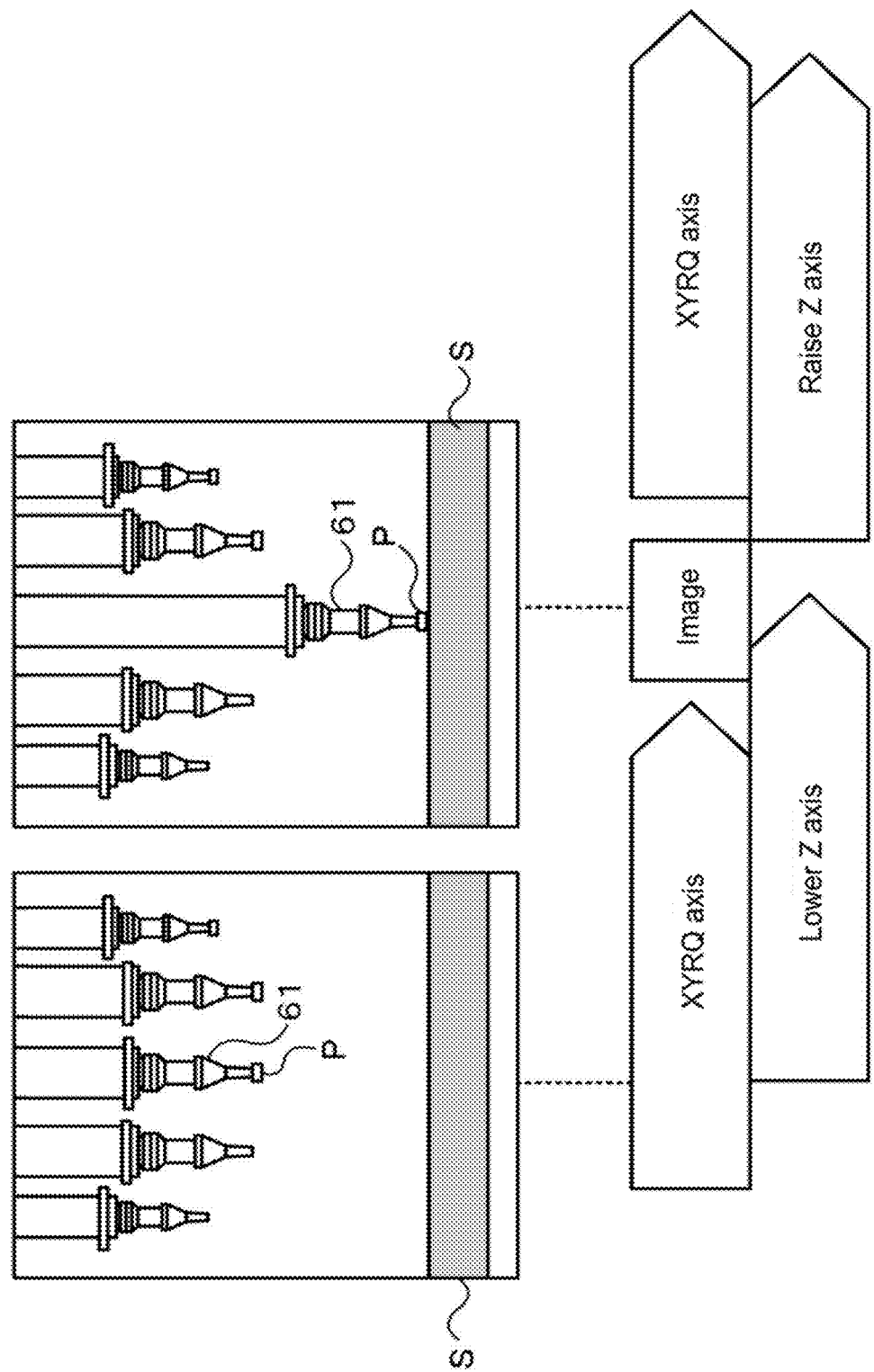
FIG. 12 illustrates imaging timing of side surface camera 80 of an alternative embodiment.
Figure 13:
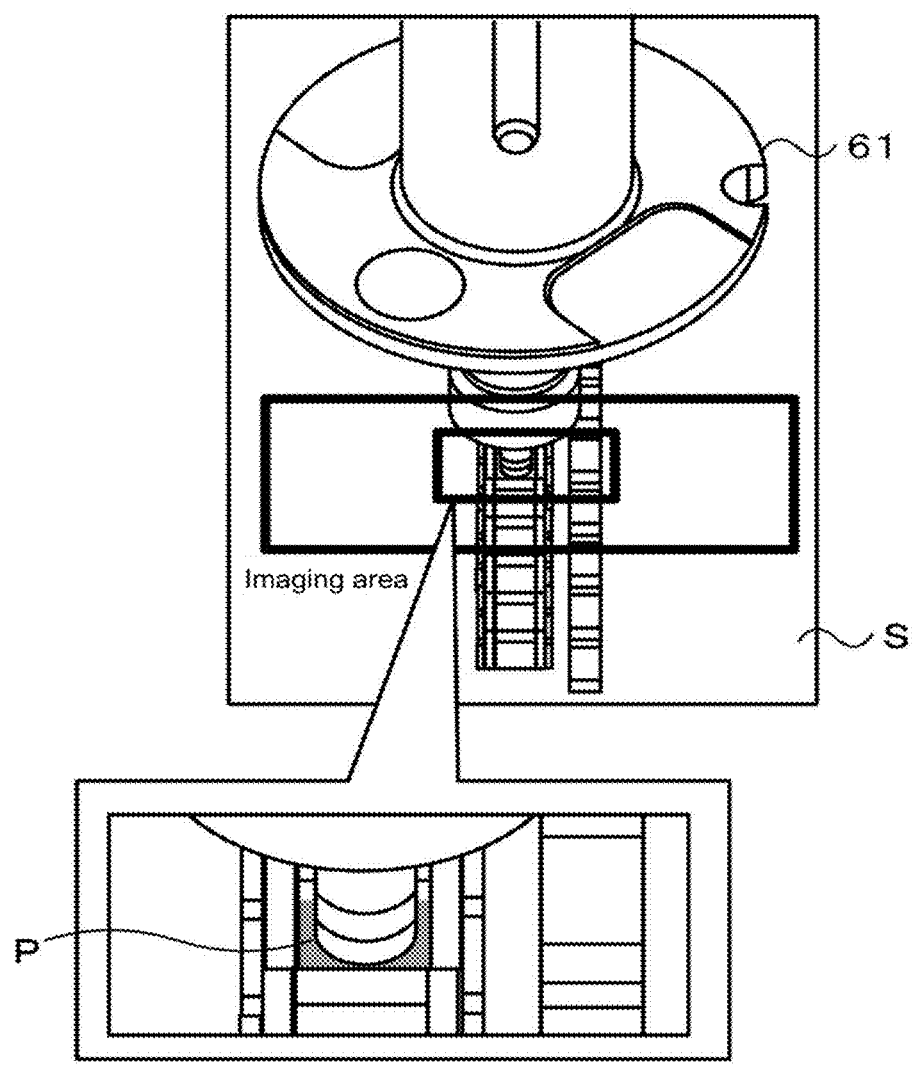
FIG. 13 illustrates states of suction nozzle 61 and board S at the imaging timing of FIG. 12.

With component mounter 10 of the present embodiment, the board image is acquired by imaging using side surface camera 80 at a timing (first timing) when component P contacts board S due to suction nozzle 61 being lowered, and a timing (second timing) at which the suction nozzle 61 has been raised by a specified amount after mounting the component P, however, it is not essential to perform imaging at the second timing. In this case, compared to a case in which imaging is performed at the second timing, it is possible to start movement in the XY directions and movement in the R direction earlier. FIG. 12 illustrates imaging timing of side surface camera 80 in an alternative embodiment; FIG. 13 shows states of suction nozzle 61 and board S at the timing from FIG. 12. As shown, imaging by side surface camera 80 is performed at a first timing at which component P being held by suction nozzle 61 contacts board S. The image obtained by imaging by side surface camera 80 at the first timing, as shown in the imaging area (board imaging area) of FIG. 13, is an image from diagonally above of a state of component P being held by suction nozzle 61 contacting board S. In this case, it is not possible to determine whether component P remains on the suction nozzle positioned at mounting position A0 from the board image within the board image area, but it is possible to determine whether component P has been mounted at the mounting position of board S. Here, in a case in which the suction nozzle 61 positioned at pre-mounting position A1 is moved to mounting position A0 and component P mounted, the suction nozzle 61 positioned at mounting position A0 is moved to post-mounting position A2. Therefore, if the suction nozzle 61 that previously performed mounting operation correctly mounted the component P, the component P does not appear in the image within the post-mounting image area from the image obtained by imaging using side surface camera 80, but if the component P remained on the suction nozzle 61 that previously performed mounting operation, the component P appears in the image. Thus, by checking the image of the post-mounting image area from the image, it is possible to determine whether the component P remained in the suction nozzle 61 that previously performed mounting operation.

With component mounter 10 of the first embodiment, the suction nozzle 61 at post-mounting position A2 and the suction nozzle 61 at pre-mounting position A1 are imaged at the same time by side surface camera 80 to acquire the post-mounting image and the pre-mounting image, but the configuration is not limited to this, and the configuration may be such that only one of post-mounting position A2 and pre-mounting position A1 is imaged. Also, the suction nozzle 61 at mounting position A0 is imaged to acquire the nozzle image, but it is not essential to image the suction nozzle 61 at mounting position A0.

With component mounter 10 of the first embodiment, the camera for acquiring the post-mounting image by imaging the suction nozzle 61 at post-mounting position A2, the camera for acquiring the pre-mounting image by imaging the suction nozzle 61 at pre-mounting position A1, and the camera for acquiring the board image by imaging the mounting position of board S are combined as a single side surface camera 80, but the configuration is not limited to this, and separate cameras may be provided.

With component mounter 10 of the first embodiment, in a case in which a mounting error occurs, measures for mounting errors are performed according to the mounting check processing of FIG. 11, but the configuration is not limited to this, and an operator may select the method for performing measures (for example, whether to discard component P from S370, whether to automatically stop from S390, whether to discard board S for which a mounting error occurred, whether to continue mounting subsequent components P after a mounting error).

With component mounter 10 of the first embodiment, control device 100, in S300 of the mounting check processing of FIG. 11, determines whether there is a component P on suction nozzle 61 positioned at pre-mounting position A1 based on the pre-mounting image from the image imaged by side surface camera 80. In this case, when it is determined that there is a component P on the suction nozzle positioned at pre-mounting position A1, during S150 of the component mounting processing of FIG. 7 to be performed after the mounting check processing, mounting operation may be performed of the next component P; but if it is determined that there is no component P on the suction nozzle 61 positioned at pre-mounting position A1, it may determined that the component P has been dropped during movement, and component mounter 10 may be automatically stopped (error stopped).

With component mounter 10 of the first embodiment, side surface camera 80 is used to acquire the image (board image) for determining whether component P held by suction nozzle 61 was correctly mounted on board S, but the configuration is not limited to this, and side surface camera 80 may be used for acquiring images for determining whether component P was correctly picked up when component P supplied by component supply device 20 is picked up by suction nozzle 61. In this case, for example, component mounter 10 (control device 100), during S120 of the component mounting processing of FIG. 7, perform imaging using side surface camera 80 at a first timing at which the suction nozzle 61 at mounting position A0 contacts component P due to being lowered, may perform imaging using side surface camera 80 at a second timing at which the suction nozzle 61 has been raised by a specified amount after the suction nozzle 61 has picked up the component P, or may perform imaging using side surface camera 80 at both the first timing and the second timing. In a case of performing imaging at the first timing, it is possible to determine whether the suction nozzle 61 performed pickup operation of component P at the correct position based on the image within an area corresponding to the board imaging area of the first embodiment. Further, in a case of performing imaging at the second timing, it is possible to determine whether a pickup error in which the suction nozzle 61 did not pick up component P occurred based on the image within an area corresponding to the board imaging area of the first embodiment. Also, among the images obtained by imaging using side surface camera 80, checking may be performed for an error with a pre-pickup suction nozzle 61 (for example, damage to the suction nozzle 61, or the presence of foreign matter on the suction nozzle 61) based on the image of pre-mounting position A1, or for the pickup state of component P (for example, whether the pickup orientation of component P is good, or for the presence/absence of component P) based on the image of post-mounting position A2.

In the embodiments, the present disclosure is described being applied to an item that uses side surface camera 80 to image suction nozzle 61 attached to rotary head 64, but the disclosure is not limited to this, and may be applied to an item that uses a side surface camera to image a suction nozzle attached to a head that does not rotate.

Correspondences between main constituent elements of the embodiments and main constituent elements of the disclosure will be clarified here. Rotary head 64 corresponds to a "head," XY robot 50 corresponds to a "horizontal moving device," Z-axis actuator 70 corresponds to a "vertical moving device," CPU 101 of control device 100 that performs the component mounting processing of FIG. 7 corresponds to a "mounting control device," side surface camera 80 corresponds to an "imaging device," mirrors 88a to 88c, 88e, and 88f correspond to a "first optical system," and mirrors 88d to 88f correspond to a "second optical system." Further, mirrors 88e and 88f correspond to a "third optical system." Also, CPU 101 of control device 100 that performs the processing of S210, S220, S250, and S260 of the mounting processing of FIG. 8 corresponds to an "imaging control device," and CPU 101 of control device 100 that performs the mounting check processing of FIG. 11 corresponds to a "determining device."

Meanwhile, it goes without saying that the disclosure is not limited to the above-mentioned embodiments and various embodiments may be applied within the technical scope of the disclosure.

INDUSTRIAL APPLICABILITY

The present disclosure may be applied to the industrial field of component mounters and the like.

1: component mounting system; 10: component mounter 12: housing; 20: component supply device; 22: tape feeder 22a: reel; 30: board conveyance device; 32: belt conveyor device; 40: backup device; 50: XY robot; 52, 56: guide rail; 54: X-axis slider; 55: X-axis actuator; 58: Y-axis slider; 59: Y-axis actuator; 60: head unit; 61: suction nozzle; 62: nozzle holder; 62a: upper end section; 62b: flange section; 64: rotary head; 64a: reflective body; 65: spring (coil spring); 66: R-axis actuator; 67: rotation shaft; 68: drive motor; 69: Q-axis actuator; 70: Z-axis actuator 72: ball screw nut; 74: screw shaft; 76: Z-axis slider 77: lever section; 78: drive motor; 79: electromagnetic valve; 80: side surface camera; 82: camera main body; 82a: imaging element; 84: optical system; 86a: left incident opening; 86b: right incident opening; 86c: upper incident opening; 86d: camera connection opening; 87: light emitting body; 88a to 88f: mirror; 90: component camera; 92: mark camera; 94: nozzle stocker; 100: control device; 101, 111: CPU; 102, 112: ROM; 103, 113: HDD; 1-4, 114: RAM; 105, 115: input/output interface; 106, 116: bus; 110: management device; 117: input device; 118: display; A0: mounting position; A1: pre-mounting position; A2: post-mounting position; P: component; S: board

The invention claimed is:
1. A component mounter configured to hold a component and mount the component on a surface of a board, the component mounter comprising:
 a head having a nozzle configured to hold the component at a nozzle tip of the nozzle;
 a horizontal moving device configured to move the head in a horizontal direction with respect to the surface of the board;
 a vertical moving device configured to move the nozzle in a vertical direction with respect to the surface of the board, the nozzle oriented in the vertical direction;
 a mounting control device configured to perform mounting operation of mounting the component held by the nozzle at a mounting position on the surface of the board by moving the head using the horizontal moving device such that the nozzle is positioned above the mounting position on the surface of the board and lowering the nozzle using the vertical moving device; and
 an imaging device provided on the head and configured to image an imaging target by receiving incident light from the imaging target on an imaging element via an optical system,
 wherein
 the optical system includes:
  an upper incident opening formed at a position facing a base section of the nozzle positioned at the mounting position,
  a lateral incident opening formed at a position lower than and horizontally from the upper incident opening,
  a first optical system configured to guide incident light entering the lateral incident opening from a direction of a side surface of the nozzle tip to a first region of the imaging element, the side surface being viewable in the horizontal direction, and a second optical system configured to guide incident light entering the upper incident opening from a direction of the surface of the board to a second region of the imaging element in a state with the nozzle above the surface of the board, the imaging device is configured to be able to image an image of the side surface of the nozzle tip and an image of the surface of the board respectively via the first optical system and the second optical system, and the optical system includes a left mirror, a right mirror, a middle mirror arranged between the left mirror and the right mirror, an upper mirror arranged at the upper incident opening, a first rear mirror arranged rearward of the middle mirror and the upper mirror, and a second rear mirror arranged above the first rear mirror.

2. The component mounter according to claim 1, wherein the head is a rotary type head provided with multiple nozzles in a circumferential direction and configured to revolve the multiple nozzles in the circumferential direction, the mounting control device performs mounting operation of mounting the component held by the nozzle at the mounting position on the surface of the board by moving the head using the horizontal moving device such that a mounting target nozzle out of the multiple nozzles is positioned above the mounting position on the surface of the board and lowering the mounting target nozzle using the vertical moving device, and the imaging device is able to image
a first image that is at least one of a side image of the nozzle tip of a pre-mounting nozzle used to perform mounting operation of the component after the mounting target nozzle or a side image of the nozzle tip of a post-mounting nozzle used to perform mounting operation of the component before the mounting target nozzle, and a second image that is an image of surface of the board when the mounting target nozzle is performing mounting operation of the component, respectively via the first optical system and the second optical system.

3. The component mounter according to claim 2, wherein the optical system includes a third optical system configured to guide incident light from a direction of the mounting target nozzle to a third region of the imaging element, and the imaging device is configured to image the first image, the second image, and a third image that is an image of the mounting target nozzle respectively via the first optical system, the second optical system, and the third optical system.

4. The component mounter according to claim 1, further comprising:
an imaging control device configured to control the imaging device such that the image of the surface of the board is imaged at a first timing at which the component held by the nozzle contacts the surface of the board when the nozzle is lowered by the vertical moving device.

5. The component mounting according to claim 4, wherein
the imaging control device is configured to control the imaging device such that, after the first timing, the side image of the nozzle tip is imaged after performing mounting operation of the component, and further provided is a determining device configured to determine whether the nozzle correctly mounted the component based on the image of the surface of the board imaged at the first timing and the side image of the nozzle tip imaged after the first timing.

6. The component mounter according to claim 1, further comprising:
an imaging control device configured to control the imaging device such that the image of the surface of the board is imaged at a second timing at which the nozzle has been raised by a specified amount by the vertical moving device after the nozzle has performed mounting operation of the component.

7. The component mounting according to claim 6, wherein
the imaging control device is configured to control the imaging device such that, before the second timing, the side image of the nozzle tip of the nozzle yet to perform mounting operation of the component is imaged, and further provided is a determining device configured to determine whether the nozzle correctly mounted the component based on the image of the surface of the board imaged at the second timing and the side image of the nozzle tip imaged before the second timing.

8. The component mounter according to claim 1, further comprising:
an imaging control device configured to control the imaging device such that the image of the surface of the board is taken at a first timing when the nozzle is lowered by the vertical moving device and at a second timing when the nozzle is raised by the vertical moving device.

9. A component mounter configured to hold a component and mount the component on a surface of a board, the component mounter comprising:
a rotary type head provided with multiple nozzles in a circumferential direction and configured to revolve the multiple nozzles in the circumferential direction;

a horizontal moving device configured to move the head in a horizontal direction with respect to the surface of the board;

a vertical moving device configured to move the nozzle in a vertical direction with respect to the surface of the board;

a mounting control device configured to perform mounting operation of mounting the component held by the nozzle at a mounting position on the surface of the board by moving the head using the horizontal moving device such that a mounting target nozzle out of the multiple nozzles is positioned above the mounting position on the surface of the board and lowering the mounting target nozzle using the vertical moving device in the vertical direction, the mounting target nozzle oriented in the vertical direction, and an imaging device provided on the head and configured to image an imaging target by receiving incident light from the imaging target on an imaging element via an optical system, wherein the imaging device is able to image:
at least one of a side image of the nozzle tip of a pre-mounting nozzle used to perform mounting operation of the component after the mounting target nozzle or a side image of the nozzle tip of a post-mounting nozzle used to perform mounting operation of the component before the mounting target nozzle, and an image of surface of the board when the mounting target nozzle is performing mounting operation of the component, and wherein the optical system includes:
- an upper incident opening formed at a position facing a base section of the mounting target nozzle positioned at the mounting position,
- a lateral incident opening formed at a position lower than and horizontally from the upper incident opening,
- a first optical system configured to guide incident light entering the lateral incident opening from a direction of a side surface of the nozzle tip of the pre-mounting nozzle or the post-mounting nozzle to a first region of the imaging element, the side surface being viewable in the horizontal direction, and
- a second optical system configured to guide incident light entering the upper incident opening from a direction of the surface of the board to a second region of the imaging element when the mounting target nozzle is performing mounting operation of the component.

10. The component mounter according to claim 9, further comprising:
- an imaging control device configured to control the imaging device such that the image of the surface of the board is taken at a first timing when the mounting target nozzle is lowered by the vertical moving device and at a second timing when the mounting target nozzle is raised by the vertical moving device.

11. The component mounter according to claim 9, wherein the optical system includes a left mirror, a right mirror, a middle mirror arranged between the left mirror and the right mirror, an upper mirror arranged at the upper incident opening, a first rear mirror arranged rearward of the middle mirror and the upper mirror, and a second rear mirror arranged above the first rear mirror.

* * * * *